US012272583B2

(12) United States Patent
Burkhart et al.

(10) Patent No.: US 12,272,583 B2
(45) Date of Patent: Apr. 8, 2025

(54) REDUCED FOOTPRINT WAFER HANDLING PLATFORM

(71) Applicant: Lam Research Corporation, Fremont, CA (US)

(72) Inventors: Christopher W. Burkhart, Los Gatos, CA (US); Richard H. Gould, Fremont, CA (US); Candi Kristoffersen, San Jose, CA (US); Michael Nordin, San Jose, CA (US); Richard M. Blank, San Jose, CA (US); Hironobu Yasuumi, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 575 days.

(21) Appl. No.: 17/253,601

(22) PCT Filed: Jun. 18, 2019

(86) PCT No.: PCT/US2019/037765
§ 371 (c)(1),
(2) Date: Dec. 17, 2020

(87) PCT Pub. No.: WO2019/246122
PCT Pub. Date: Dec. 26, 2019

(65) Prior Publication Data
US 2021/0272832 A1    Sep. 2, 2021

Related U.S. Application Data

(60) Provisional application No. 62/686,555, filed on Jun. 18, 2018.

(51) Int. Cl.
*H01L 21/677* (2006.01)
*H01L 21/67* (2006.01)
*H01L 21/683* (2006.01)

(52) U.S. Cl.
CPC .. *H01L 21/67742* (2013.01); *H01L 21/67259* (2013.01); *H01L 21/67276* (2013.01); *H01L 21/67766* (2013.01); *H01L 21/6838* (2013.01)

(58) Field of Classification Search
CPC ......... H01L 21/67742; H01L 21/67276; H01L 21/67766; H01L 21/6838
See application file for complete search history.

(56) References Cited

U.S. PATENT DOCUMENTS

2007/0295274 A1 * 12/2007  Webb ................ H01L 21/67173
                                                         118/719
2013/0230369 A1 *  9/2013  Hofmeister ....... H01L 21/67709
                                                         414/217

(Continued)

FOREIGN PATENT DOCUMENTS

CN      101383311        3/2009
CN      104349872 A      2/2015

(Continued)

OTHER PUBLICATIONS

European Application Serial No. 108121082, Voluntary Amendment filed Nov. 26, 2019, 27 pgs.

(Continued)

*Primary Examiner* — Gerald McClain
(74) *Attorney, Agent, or Firm* — Schwegman Lundberg & Woessner, P.A.

(57) ABSTRACT

A system comprises an equipment front end module (EFEM), a vacuum transfer module (VTM), a plurality off quad station process modules (QSMs). The EFEM is configured to receive a plurality of wafers. The EFEM comprises an EFEM transfer robot. The vacuum transfer module (VTM) is configured to receive the plurality of wafers from the EFEM. The VTM comprises a VTM transfer robot. The plurality of quad station process modules (QSMs) is coupled to the VTM. The VTM transfer robot is configured Oto (Continued)

transfer wafers between the VTM and the plurality of QSMs. The EFEM transfer robot is configured to transfer wafers between the EFEM and the VTM.

20 Claims, 15 Drawing Sheets

(56) References Cited

U.S. PATENT DOCUMENTS

| | | | |
|---|---|---|---|
| 2014/0003891 A1 | | 1/2014 | Kobayashi |
| 2014/0072397 A1* | | 3/2014 | Mooring .......... H01L 21/67161 414/805 |
| 2016/0358808 A1 | | 12/2016 | Madsen et al. |

FOREIGN PATENT DOCUMENTS

| | | | | |
|---|---|---|---|---|
| CN | 105551998 A | | 5/2016 | |
| CN | 112335030 | | 2/2021 | |
| JP | H08340034 A | | 12/1996 | |
| JP | 2003060009 A | | 2/2003 | |
| JP | 2003142410 A | * | 5/2003 | |
| JP | 2012204698 A | * | 10/2012 | ....... H01L 21/67173 |
| KR | 20180045316 A | * | 5/2018 | ....... H01L 21/67763 |
| TW | 201349376 A | | 12/2013 | |
| TW | 201637112 A | | 10/2016 | |
| TW | 201727798 A | | 8/2017 | |
| TW | 1828710 B | | 1/2024 | |

OTHER PUBLICATIONS

International Application Serial No. PCT/US2019/037765, International Search Report mailed Oct. 4, 2019, 4 pgs.
International Application Serial No. PCT/US2019/037765, Written Opinion mailed Oct. 4, 2019, 18 pgs.
"International Application Serial No. PCT US2019 037765, International Preliminary Report on Patentability mailed Dec. 30, 2020", 11 pages.
"Chinese Application Serial No. 201980041184.7, Office Action mailed Jan. 13, 2025", w English translation, 9 pgs.
"Korean Application Serial No. 10-2021-7001454, Response filed Jan. 31, 2025 to Notice of Preliminary Rejection mailed Nov. 28, 2024", W English Claims, 38 pgs.
"Chinese Application Serial No. 201980041184.7, Response filed Oct. 18, 2024 to Office Action mailed Jun. 18, 2024", w/English claims, 5 pgs.
"Chinese Application Serial No. 201980041184.7, Office Action mailed Jun. 18, 2024", w/ English translation, 11 pgs.
"Korean Application Serial No. 10-2021-7001454, Notice of Preliminary Rejection mailed Feb. 27, 2024", w/ English Translation, 8 pgs.
"Korean Application Serial No. 10-2021-7001454, Notice of Preliminary Rejection mailed Nov. 28, 2024", w/ English Translation, 11 pgs.
"Korean Application Serial No. 10-2021-7001454, Response filed Apr. 29, 2024 to Notice of Preliminary Rejection mailed Feb. 27, 2024", W/English Claims, 20 pgs.
"Taiwanese Application Serial No. 108121082, Office Action mailed Apr. 12, 2023", w/ English Translation, 25 pgs.
"Taiwanese Application Serial No. 108121082, Response filed Aug. 10, 2023 to Office Action mailed Apr. 12, 2023", w/ English claims, 30 pgs.

* cited by examiner

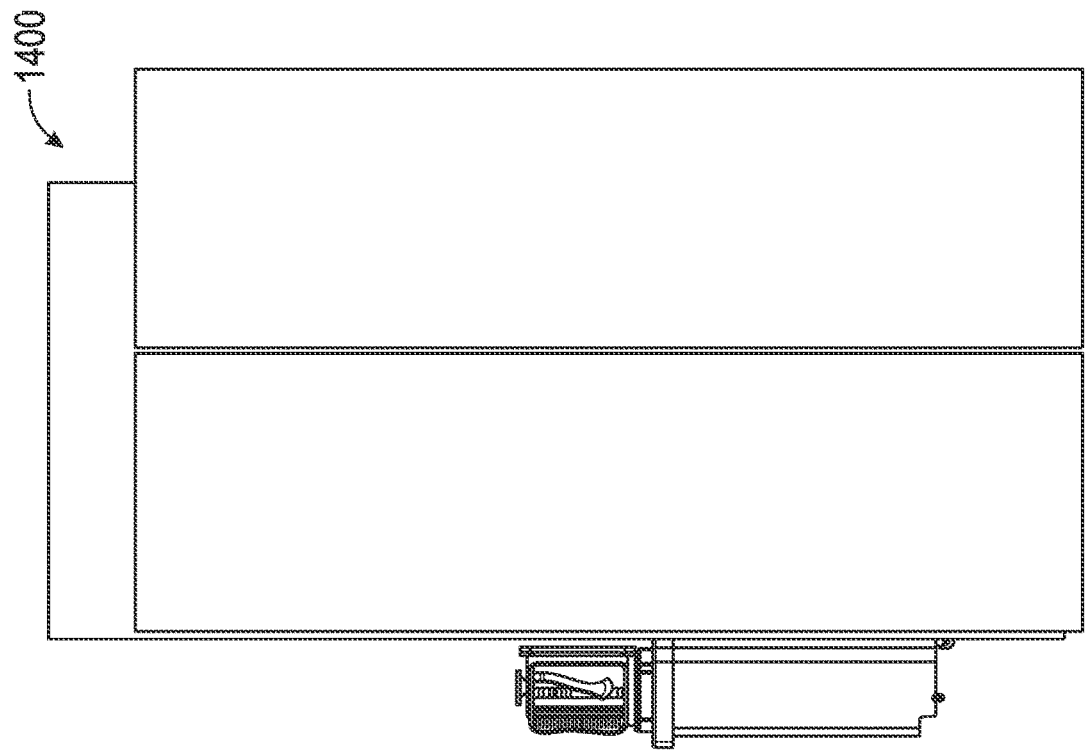
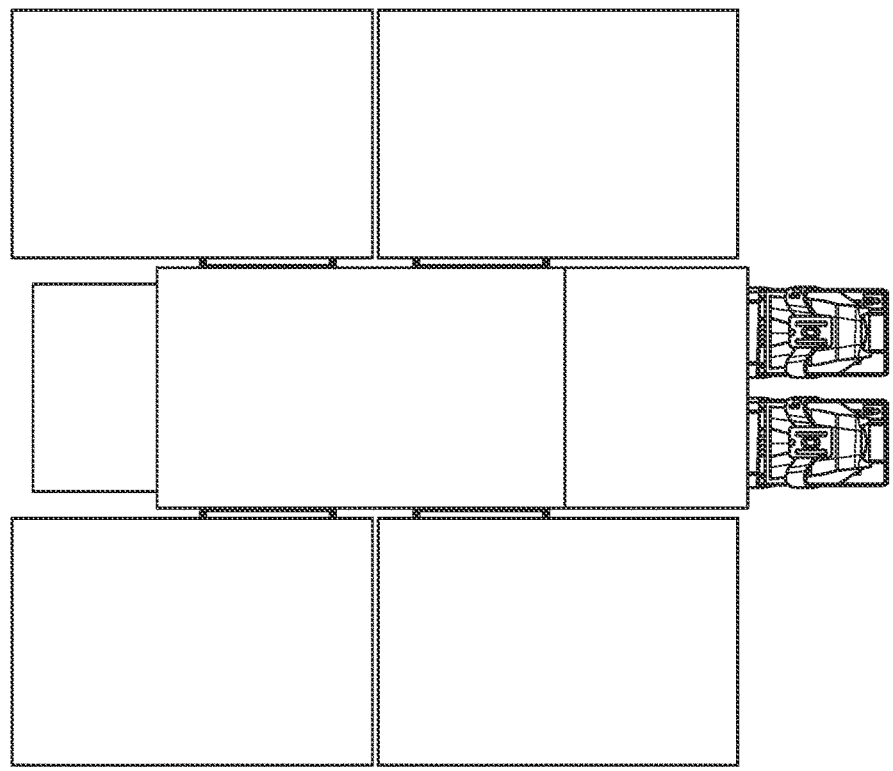
FIG. 14

REDUCED FOOTPRINT WAFER HANDLING PLATFORM

CLAIM OF PRIORITY

This application is a U.S. National Stage Filing under 35 U.S.C. 371 from International Application No. PCT/US2019/037765, filed on Jun. 18, 2019, and published as WO 2019/246122 A1 on Dec. 26, 2019, which claims the benefit of priority to U.S. Patent Application Ser. No. 62/686,555, filed on Jun. 18, 2018, each of which is incorporated by reference herein in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings, that form a part of this document: Copyright Lam Research Corporation, 2018, All Rights Reserved.

FIELD

The present disclosure relates to substrate processing systems, and more particularly to configurations of substrate processing tools in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system may be used to perform deposition, etching and/or other treatment of substrates such as semiconductor wafers. During processing, a substrate is arranged on a substrate support in a processing chamber of the substrate processing system. During etching or deposition, gas mixtures including one or more etch gases or gas precursors, respectively, are introduced into the processing chamber and plasma may be struck to activate chemical reactions.

The substrate processing system may include a plurality of substrate processing tools arranged within a fabrication room. Each of the substrate processing tools may include a plurality of process modules. Typically, a substrate processing tool includes up to six process modules.

Referring now to FIG. 1, a top-down view of an example substrate processing tool 100 is shown. The substrate processing tool 100 includes a plurality of process modules 104. In some examples, each of the process modules 104 may be configured to perform one or more respective processes on a substrate. Substrates to be processed are loaded into the substrate processing tool 100 via ports of a loading station of an equipment front end module (EFEM) 108 and then transferred into one or more of the process modules 104. For example, a substrate may be loaded into each of the process modules 104 in succession. Referring now to FIG. 2, an example arrangement 100 of a fabrication room 204 including a plurality of substrate processing tools 208 is shown.

FIG. 3 shows a first example configuration 300 including a first substrate processing tool 304 and a second substrate processing tool 308. The first substrate processing tool 304 and the second substrate processing tool 308 are arranged sequentially and are connected by a transfer stage 312, which is under vacuum. As shown, the transfer stage 312 includes a pivoting transfer mechanism configured to transfer substrates between a vacuum transfer module (VTM) 316 of the first substrate processing tool 304 and a VTM 320 of the second substrate processing tool 308. However, in other examples, the transfer stage 312 may include other suitable transfer mechanisms, such as a linear transfer mechanism. In some examples, a first robot (not shown) of the VTM 316 may place a substrate on a support 324 arranged in a first position, the support 324 is pivoted to a second position, and a second robot (not shown) of the VTM 320 retrieves the substrate from the support 324 in the second position. In some examples, the second substrate processing tool 308 may include a storage buffer 328 configured to store one or more substrates between processing stages.

The transfer mechanism may also be stacked to provide two or more transfer systems between the substrate processing tools 308 and 304. Transfer stage 312 may also have multiple slots to transport or buffer multiple substrates at one time.

In the configuration 300, the first substrate processing tool 304 and the second substrate processing tool 308 are configured to share a single equipment front end module (EFEM) 332.

FIG. 4 shows a second example configuration 400 including a first substrate processing tool 404 and a second substrate processing tool 408 arranged sequentially and connected by a transfer stage 412. The configuration 400 is similar to the configuration 300 of FIG. 3 except that in the configuration 400, the EFEM is eliminated. Accordingly, substrates may be loaded into the first substrate processing tool 404 directly via airlock loading stations 416 (e.g. using a storage or transport earner such as a vacuum wafer carrier, front opening unified pod (FOUP), an atmospheric (ATM) robot, etc., or other suitable mechanisms).

In some conventional examples, and with reference to FIG. 13 of the accompanying drawings, the operations of an EFEM 1302 in a conventional example configuration 1300 may include (a) receiving FOUPS 1304 from an overhead automatic material handling system (AMHS) 1306, then (b) removing at 1310 the wafers from the FOUPS 1304, and in the case of vacuum processing, (c) transferring the wafers at 1312 into load locks 1308 (LLs) for vacuum pump-down. After further handling in the VTM 1320, the wafers are returned at 1314 to the LLs 1308 for vent up, then placed in the FOUPs 1304. Finally, the FOUPS 1304 are removed by the AMI-IS 1306. Typically, the front end of the EFEM 1302 has two or more load ports 1316 attached. The load ports 1316 handle FOUPS 1304 and interface to the AMHS 1306. The load ports 1316 also open the FOUP doors to facilitate wafer transfer within the clean mini-environment of the EFEM 102. The flow of filtered laminar air in the EFEM 1302 is shown at 1322.

Typical semiconductor wafer processing systems of the type described above may thus be very space-consuming, as they have been architected to include, for example, at least an EFEM, one or more load ports, one or more load locks (LLs) projecting forward of the wafer processing modules, a VTM, an atmospheric (ATM) robot, and one or more FOUPs. In conventional arrangements, a single wafer transfer plane (WTP) (1318, FIG. 13) extends from the FOUPS 1304 to the VTM 1320. While the horizontally spaced or spread-out configuration of these components may allow good access for example to the atmospheric (ATM) robot, LLs, and VTM for maintenance, over time the reliability of these modules has improved, resulting in less maintenance being required in these areas.

SUMMARY

The present disclosure relates generally to systems and methods for reducing wafer fabrication cost by improving a footprint productivity (defined as wafer throughput divided by system footprint) of wafer processing tools by relocating the EFEM's key components such as the load ports, a mini-environment (or mini-environment module), an atmospheric (ATM) robot, and the load locks (LL) such that they fall within or nearly within existing boundaries of the processing modules or tools of the system. In some examples, some components are relocated and/or stacked. In one example, components such as the load ports, ATM robot and mini-environment of the EFEM are located over a VTM chamber to form a stacked configuration.

In some examples of the present disclosure, wafer transfer between components takes place in different planes. In other words, different phases or operations in the wafer processing system occur in regions that are vertically spaced from one another. Thus, in contrast to the substantially horizontal transfer of a wafer throughout the system described above, the stacked configuration of examples of the present disclosure allow wafer transfer to occur in different planes throughout the overall process. Using systems and methods of the present disclosure, a footprint of a conventional wafer processing system, such as a system shown in one of FIGS. 3-4, and FIG. 13, may be reduced substantially while maintaining full productivity. Footprint productivity i.e., wafer throughput divided by system footprint, may therefore be improved significantly in some examples.

Many configurations or system layouts of the EFEM's key components are possible within the scope of this disclosure. Thus, in some examples, a clean mini-environment module (for example within an EFEM), and ATM robot and load locks (LLs), may be arranged to lie in one or more horizontally stacked planes within the existing boundary of conventional wafer processing modules. For tall process modules, for example, one approach includes location of the EFEM above the VTM chamber. In other examples, for wafer processing systems having shorter process modules, or process modules not necessarily requiring significant maintenance access from the top, the FOUP load ports are also included within the existing boundary of the processing modules.

BRIEF DESCRIPTION OF THE DRAWINGS

Some embodiments are illustrated by way of example and not limitation in the views of the accompanying drawing:

FIGS. 7 and 14 show plan views of system configurations, according to example embodiments.

DESCRIPTION

The description that follows includes systems, methods, techniques, instruction sequences, and computing machine program products that embody illustrative embodiments of the present disclosure. In the following description, for purposes of explanation, numerous specific details are set forth in order to provide a thorough understanding of example embodiments. It will be evident, however, to one skilled in the art that the present disclosure may be practiced without these specific details.

In some examples, wafers are transferred from FOUP to LL and from LL to VT M in a stacked architecture. In some examples, in order to utilize existing vacuum process modules, a conventional single wafer transfer plane (WTP) throughout the LL's, VTM chamber, and process chambers is divided into two (or more) WTPs. One WTP may be disposed at a lower elevation for a vacuum wafer transfer, and another WTP provided at a higher elevation for atmospheric wafer transfer, for example. In some examples, FOUPS, load ports, ATM robot, and mini-environment are stacked over a system WTP to bring them within the boundary of the process modules of substrate processing tools 304 and 404, for example. This reduces system depth by approximately 1-2 meters (+/−20 cm), without impacting system width, and substantially reducing system footprint.

In some examples, a relatively tall (or high aspect ratio) LL joins or spans across the two WTPs. The LL may have an internal wafer indexer (Z-axis) to pump down and vent up multiple wafers simultaneously, for example in batches of 25 wafers. Other batches are possible. In one embodiment, a door (open to atmosphere) for wafer transfer to and from FOUPs is located within an upper section of the LLs. A door (under vacuum) for wafer transfer to and from a VTM chamber is located within the lower section of the LLs.

Figure 1:
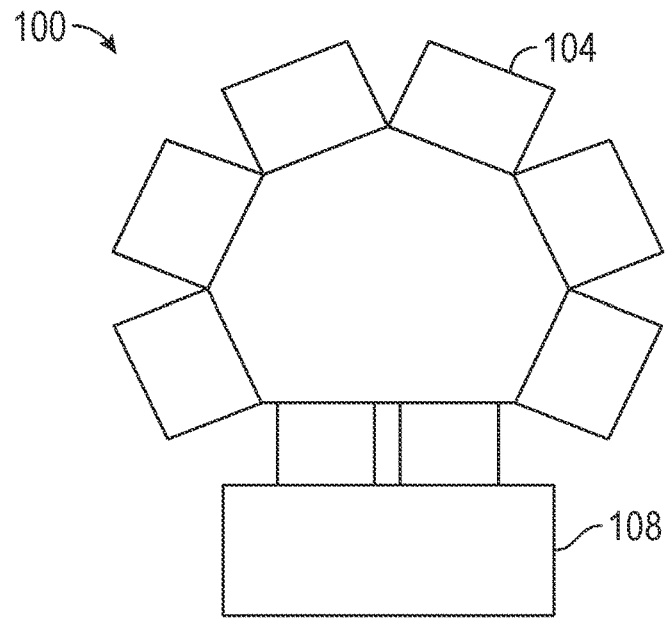
FIGS. 1-4 and 13 show schematic views of prior art substrate processing tools.
Figure 2:
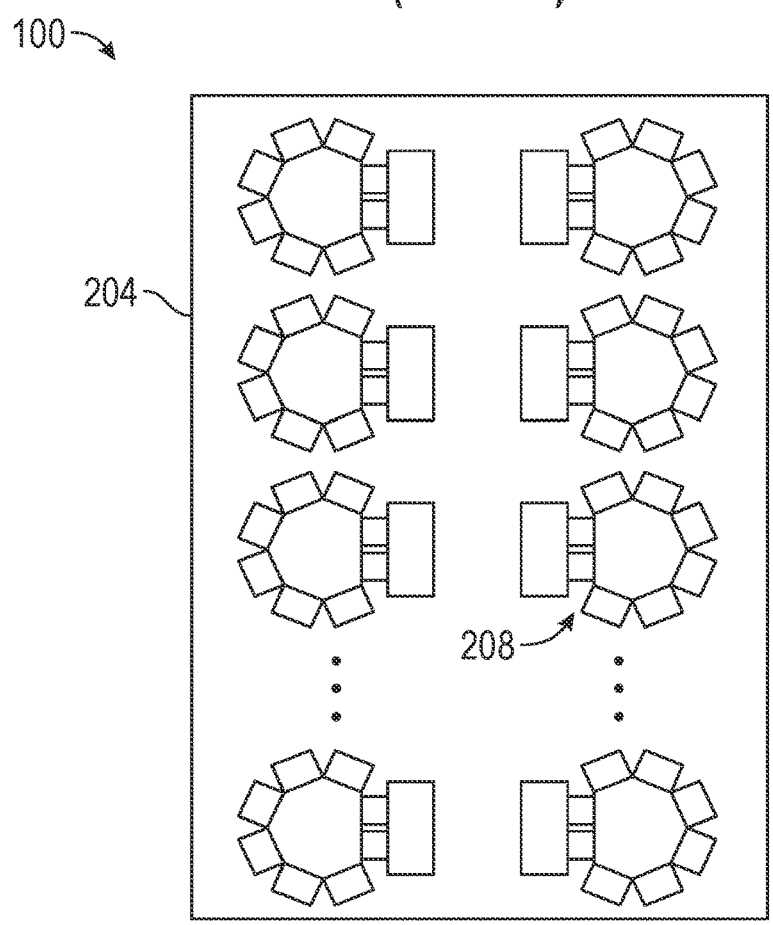
Figure 3:
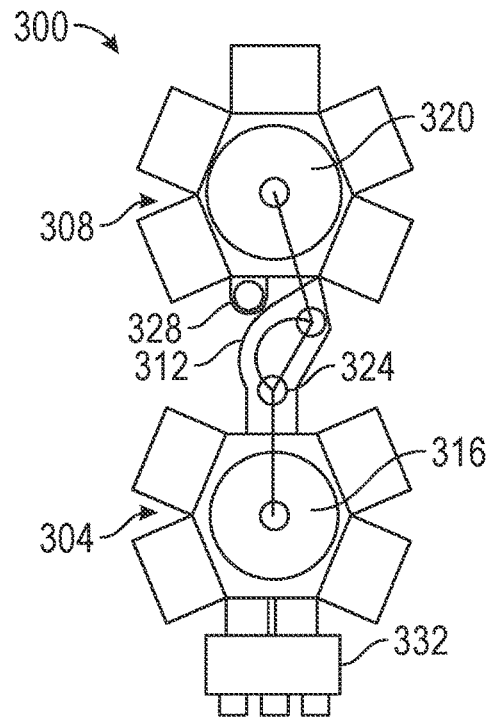
Figure 4:
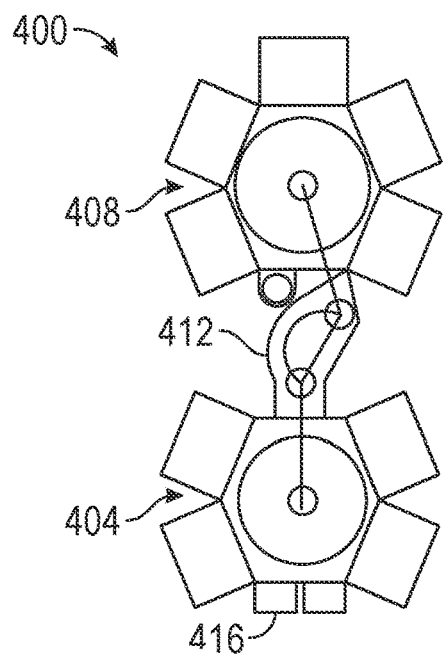
Figure 5:
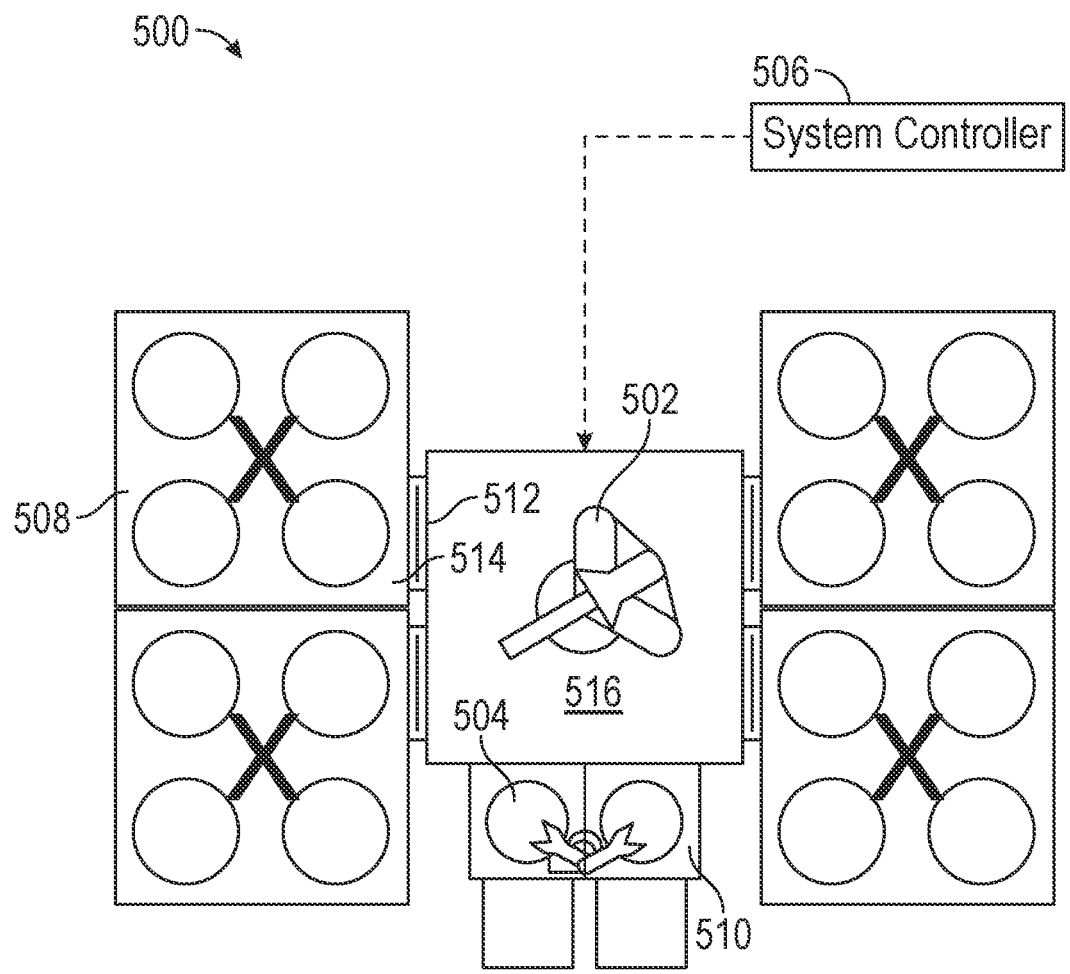
FIG. 5 is a schematic view of an example substrate processing tool.

The methods and systems of the present disclosure may be applied to quad station process modules (QSMs). In some examples, as shown in FIG. 5, a quad station process module is shown. A substrate processing tool 500 includes transfer robots 502 and 504, referred to collectively as transfer robots 502/504. The processing tool 500 is shown without mechanical indexers for example purposes. In other examples, respective process modules 508 of the tool 500 may include mechanical indexers.

A VTM 516 and an EFEM 510 may each include one of the transfer robots 502/504. The transfer robots 502/504 may have the same or different configurations. In some examples, the transfer robot 502 is shown having two arms, each having two vertically stacked end effectors. The robot 502 of the VTM 516 selectively transfers substrates to and from the EFEM 510 and between the process modules 508. The robot 504 of the EFEM 510 transfers substrates into and out of the EFEM 510. In some examples, the robot 504 may have two arms, each arm having a single end effector or two vertically stacked end effectors. A system controller 506 may control various operations of the illustrated substrate processing tool 500 and its components including, but not limited to, operation of the robots 502/504, and rotation of the respective indexers of the process modules 508, and so forth.

The tool 500 is configured to interface with, for example, four of the process modules 508 each having a single load station accessible via a respective slot 512. In this example, sides 514 of the VTM 516 are not angled (i.e., the sides 514 are substantially straight or planar). In this manner, two of the process modules 508, each having a single load station, may be coupled to each of the sides 514 of the VTM 516. Accordingly, the EFEM 510 may be arranged at least partially between two of the process modules 508 to reduce a footprint of the tool 500.

Figure 6:
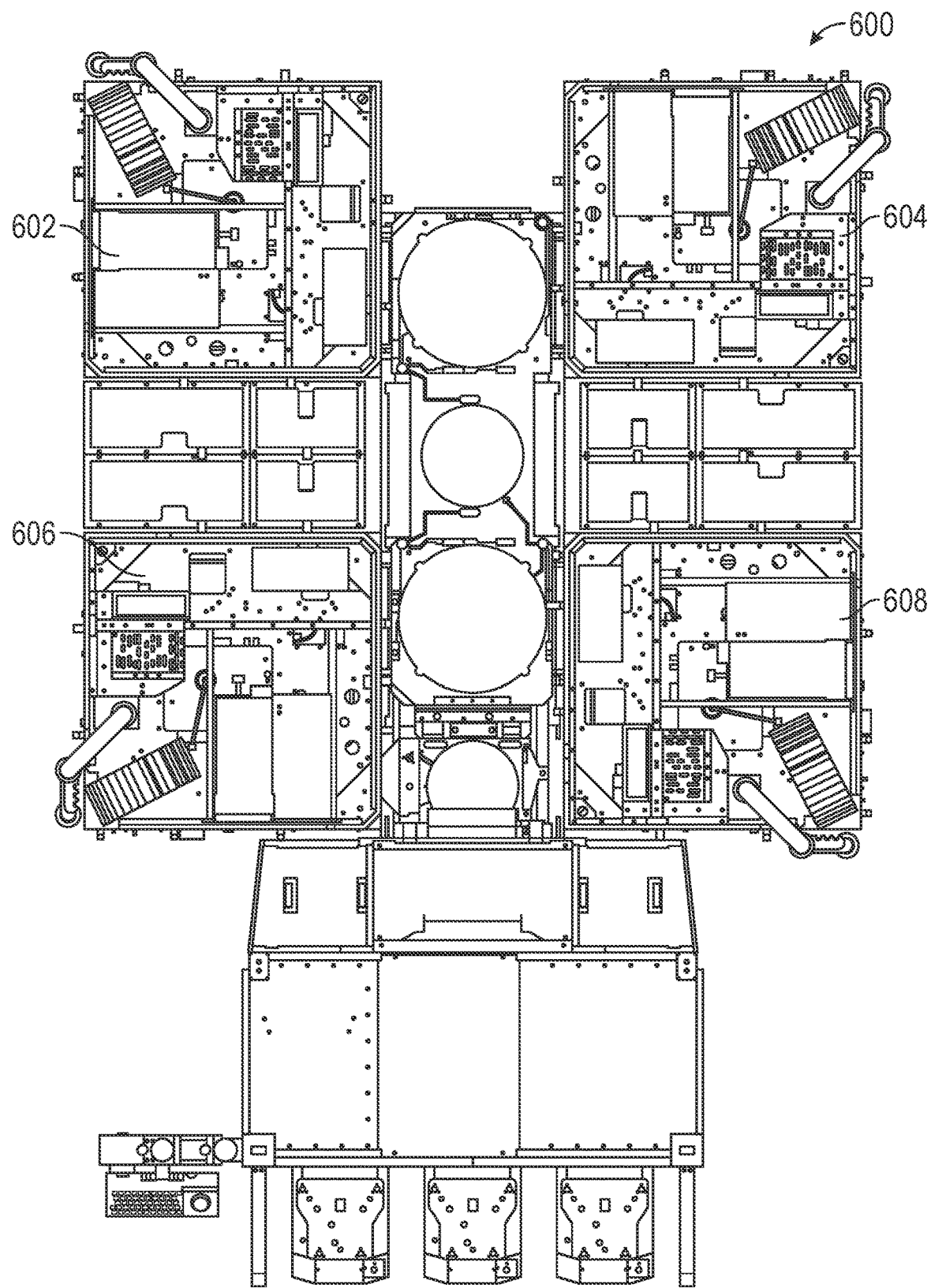
FIG. 6 is a plan view of a conventional quad station process module configuration.
Figure 7:
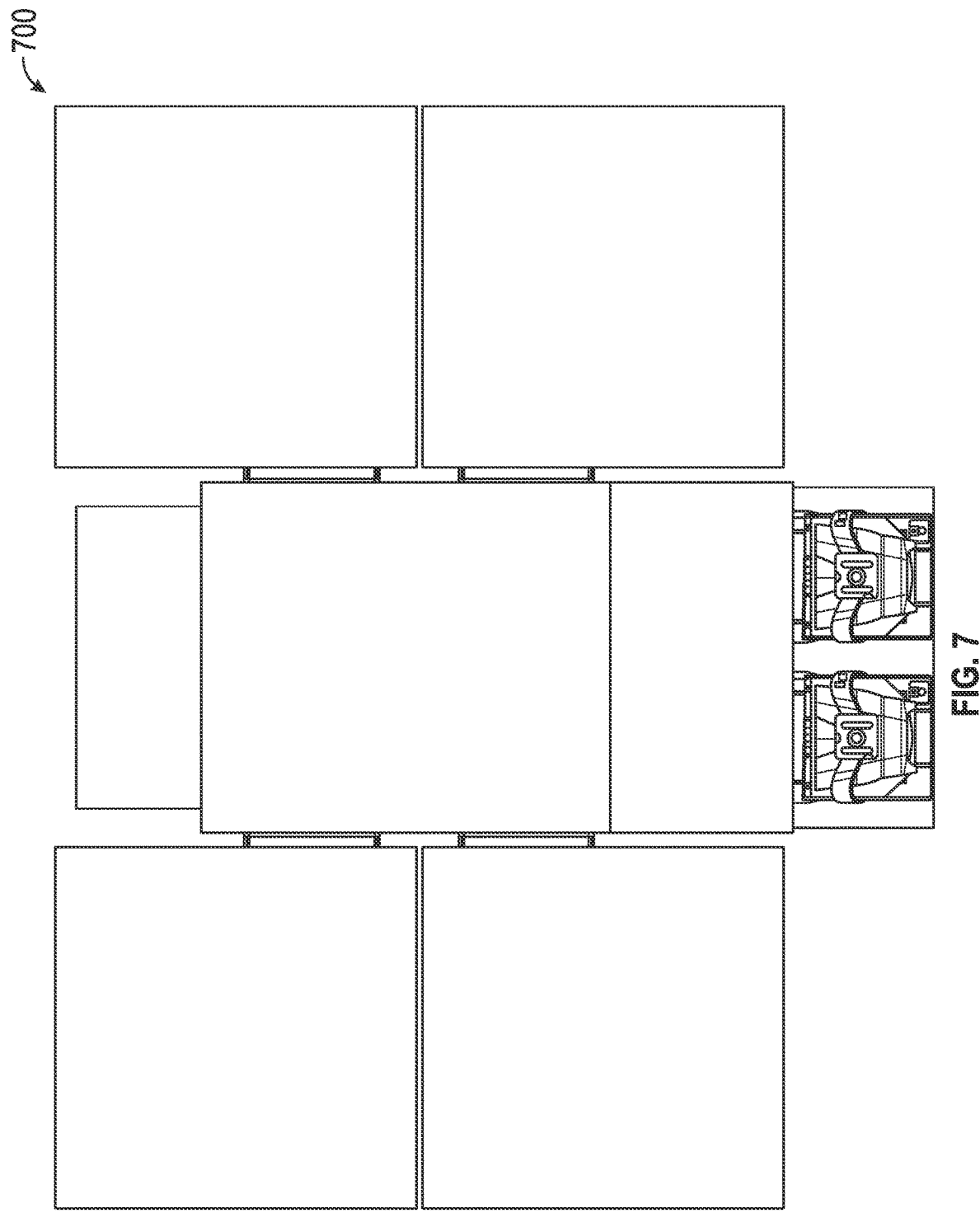
Figure 8:
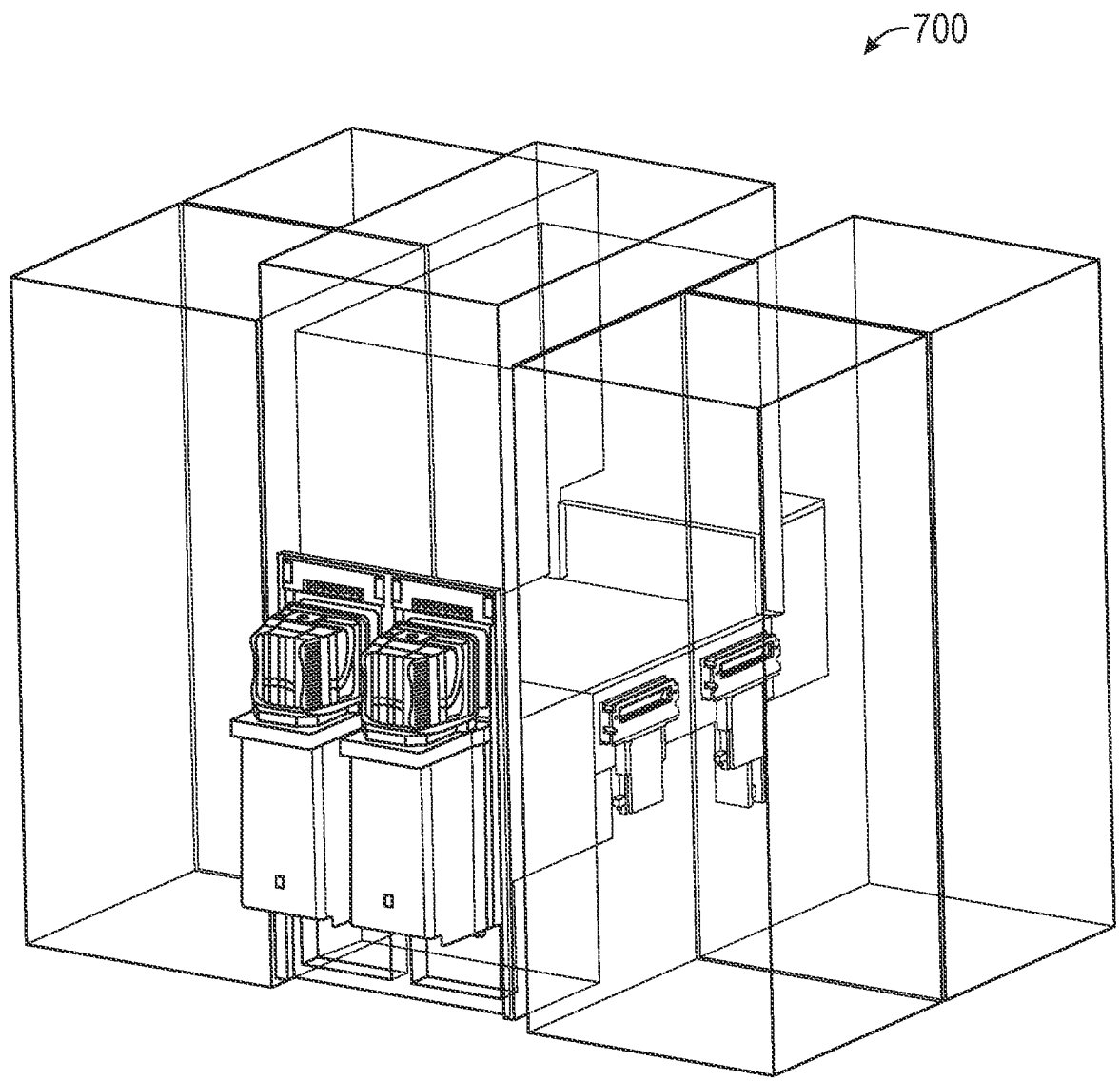
FIGS. 8-10 show perspective, plan and side views respectively of a system configuration, according to an example embodiment.

FIG. 6 of the accompanying drawings provides a plan view of a conventional quad station process module configuration 600. Four QSMs are shown at 602, 604, 606, and 608. Example outline dimensions are as indicated and provide a base line for calculating an improved footprint productivity using the systems and methods of the present disclosure. FIG. 7 illustrates in block outline a plan view of a stacked configuration 700 of wafer processing components in accordance with this disclosure with example overall (smaller) dimensions as shown. FIG. 8 shows a perspective view of the stacked configuration 700 of FIG. 7 in block outline form. In some examples, and as illustrated, minimum system configuration requirements include the provision of four quad stations, two load ports, and a maximum substrate throughput no less than the throughput of conventional systems.

Figure 9:
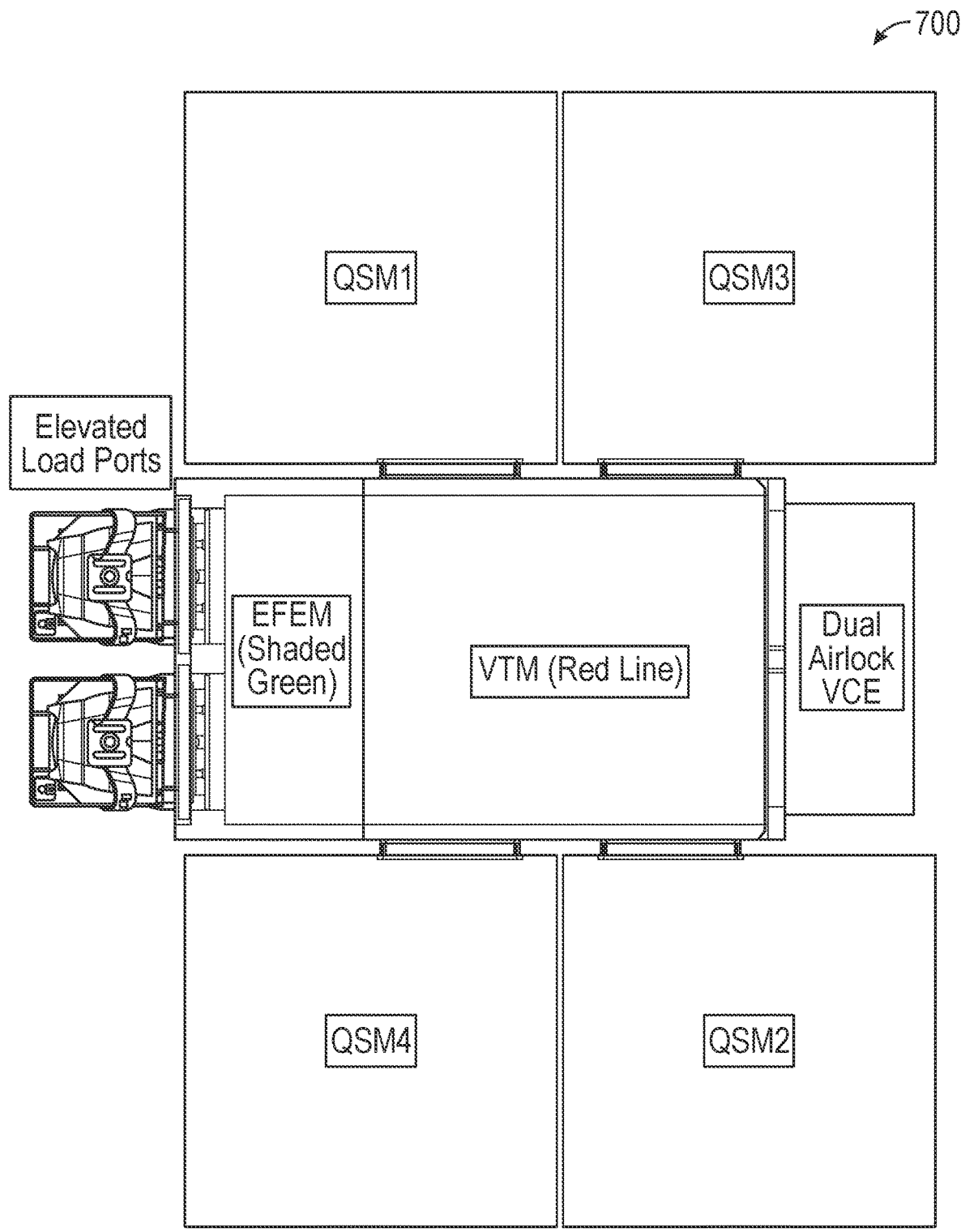
Figure 10:
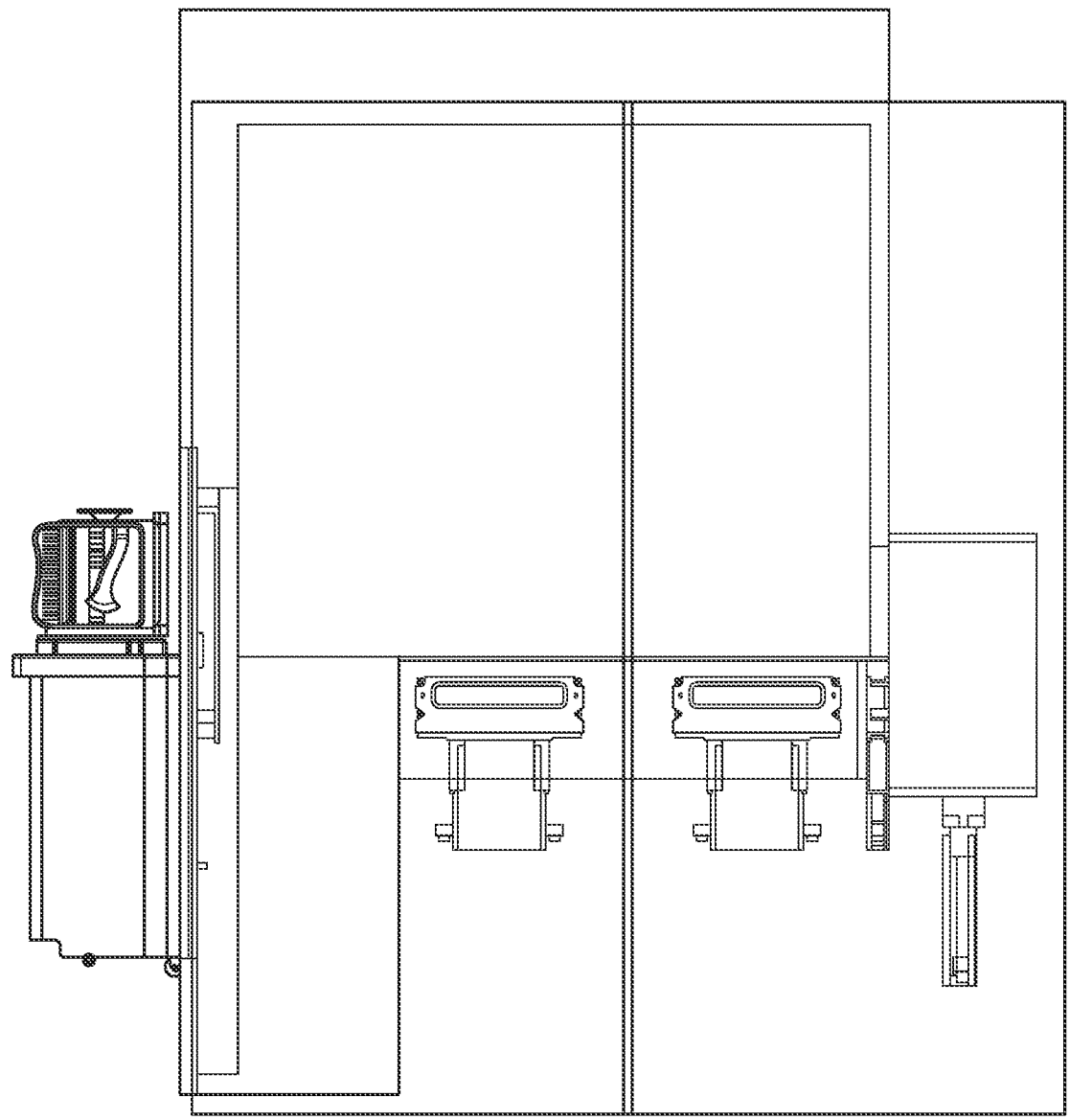

In assessing a footprint productivity improvement, a conventional baseline footprint is approximately 15 m². The footprint of the stacked configuration 700 shown in FIGS. 7-8 is approximately 9.55 m². This leads to a 1.57 footprint productivity improvement corresponding to an improvement of approximately 60%+/−10%. Further design criteria include a platform-to-VTM width defined by a two load-port interface, a platform depth defined by a load port depth, and a depth defined by two quad stations. If a quad station side service is desired, the platform depth may be increased by, for example, 50-60 cm by adding space between the quad stations. In this configuration, the footprint of the stacked configuration is approximately 11.8 m². This leads to a 1.27 footprint productivity improvement corresponding to an improvement of approximately 30+/−10%). FIGS. 9-10 show plan and side views of a system layout for the stacked configuration 700 shown in FIG. 8, respectively. Alternate dimensions of a footprint of an example stacked configuration 1400 are provided in FIG. 14 of the accompanying drawings.

Figure 11:
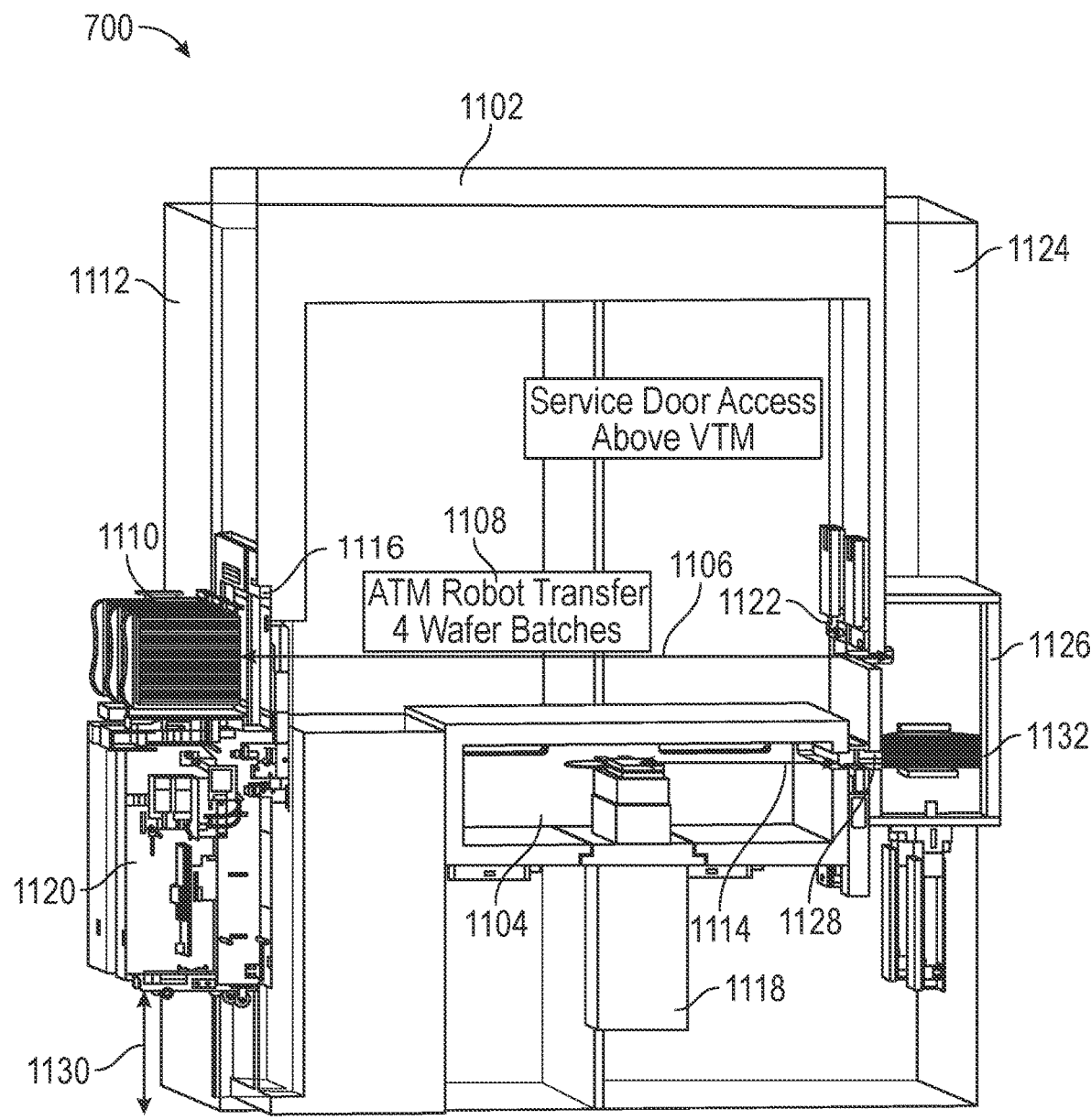
FIG. 11 is a part-sectional side view of a system configuration, according to an example embodiment.

With reference to FIG. 11, an EFEM 1102 may include one or more elevated load ports 1116 In the view, an ATM transfer robot 1108 can transfer a number of wafer batches, for example four wafer batches delivered in a FOUP 1110, across a first wafer transfer plane 1106. The first wafer transfer plane 1106 extends from the load port 1116 located above the ATM robot 1120 to a service door 1122 located on the other side of the EFEM 1102 above a vertically-movable dual airlock VCE 1126. The service door 1122 and a lower service door 1128 provide access to and from the EFEM 1102 and a VTM 1104, respectively. The lower service door 1128 allows movement of wafers 1132 under vacuum from the dual airlock VCE 1126 to the VTM 1104. A vacuum transfer robot 1118 transfers the wafers 1132 within the VTM 1104 along a second wafer transfer plane 1114. Two representative quad station process modules (QSMs) are also visible at 1112 and 1124 in the view.

In some examples, the elevated configuration of the load port 1116 may necessitate an ATM robot 1120 that is able to move up and down in front of or across one or more load ports 1116. The load ports 1116 are elevated to allow the provision of the second elevated wafer transfer plane 1114. To accommodate this extra plane 1114, the ATM robot 1120 has Z-direction capability (shown at 1130) for automated or manual loading of the FOUP 1110. A wafer batch transfer may include a four-blade EE with eight slots provided in the VCE 1126 for fast wafer transfer (four wafers in, four wafers out). In some examples, a wafer batch may include 25 wafers. Here, a larger VCE 1126 may be required, which may increase cost and pump up and vent time. A larger VCE 1126 may limit access to the VTM 1104 over the VCE 1126.

In some examples, a dual VCE 1126 configuration is utilized. This arrangement allows vacuum processing and atmospheric processing to occur in parallel phases. The height of a dual VCE 1126 may be configured to optimize a slot valve opening size, a number of desired slots, and a requisite bottom clearance dimension for an ATM robot 1120. In some examples, a vacuum transfer robot 1118 includes a five-axis dual EE in a non-radial configuration as an alternate to a radial configuration for example as described above.

Figure 12:
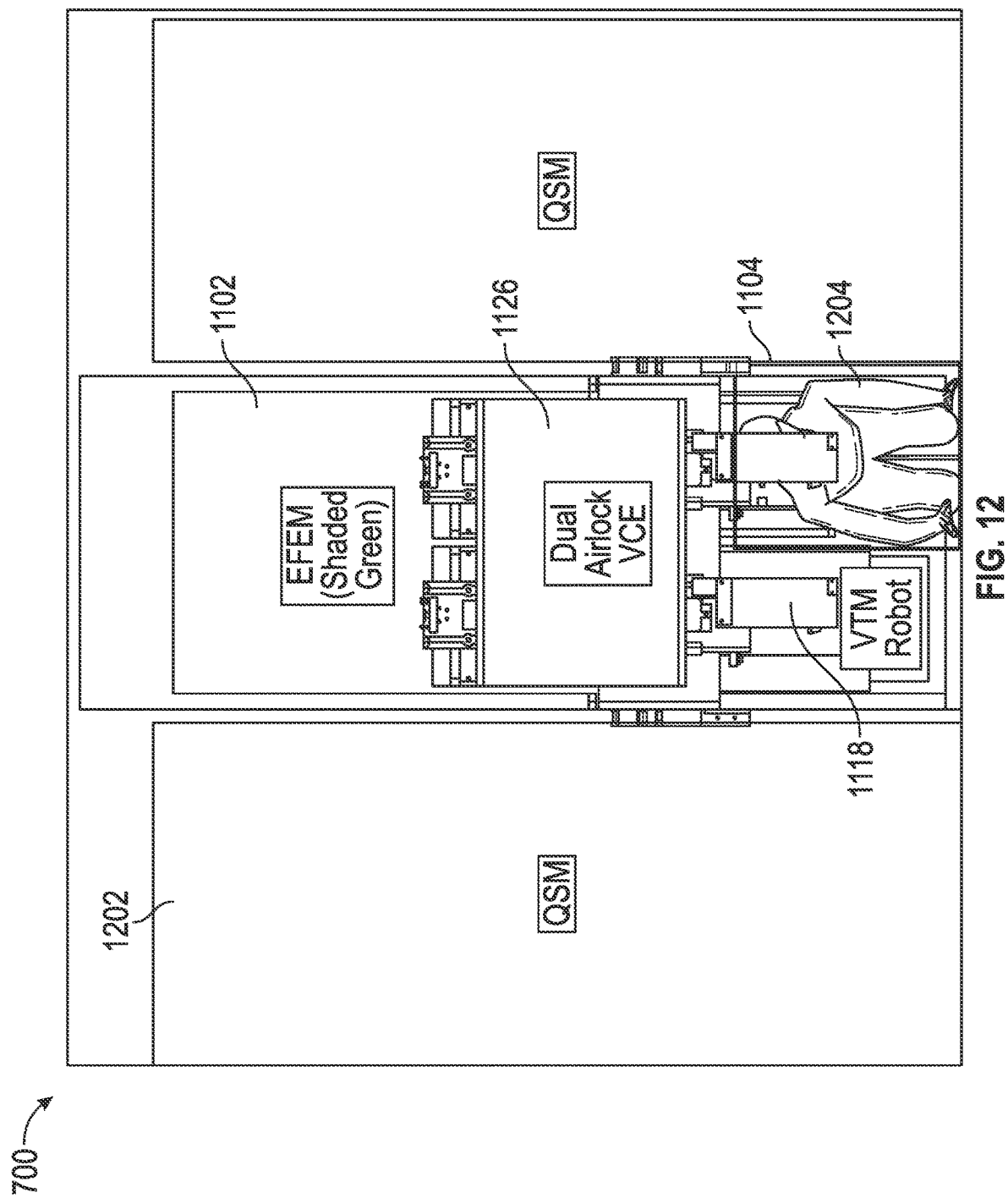
FIG. 12 is a part-sectional end view of the system configuration shown in FIG. 11.
Figure 13:
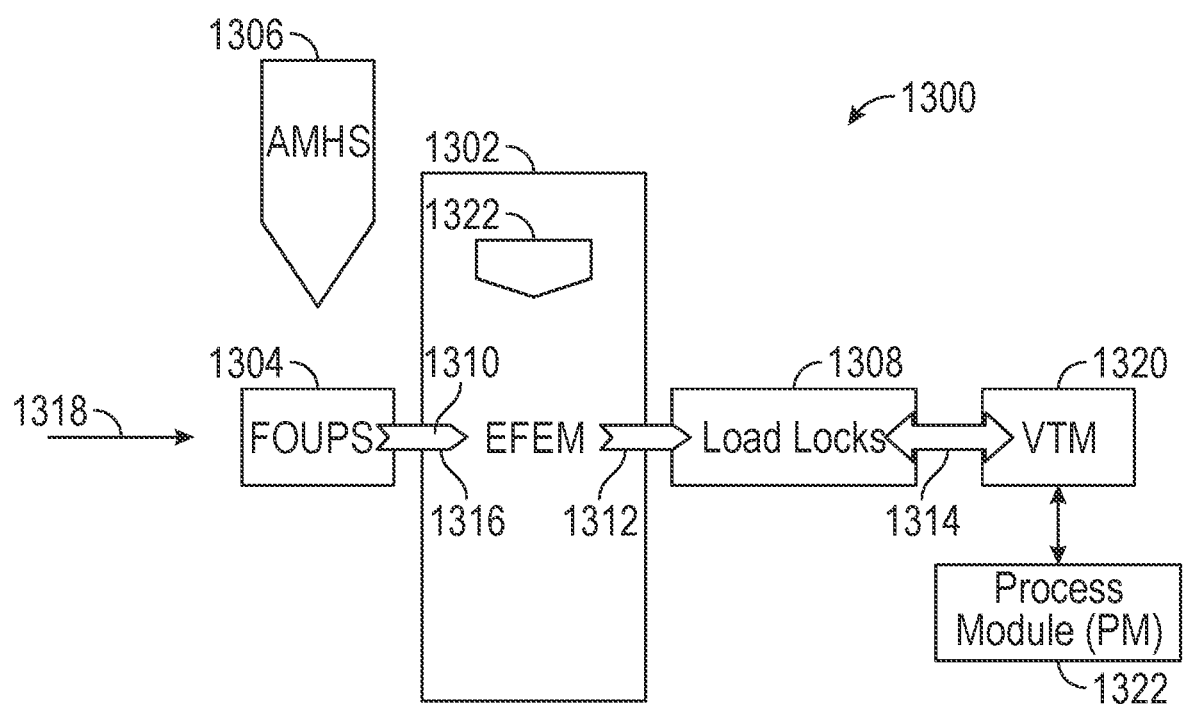

With reference to FIG. 12, the vacuum transfer robot 1118 location may be located nearer a lateral side of the VTM 1104 to allow service access past the vacuum transfer robot 1118 under vacuum conditions, for example. An example representation of a human operator 1204 having service access to the VTM transfer robot 1118 is shown in FIG. 12. In this view, an EFEM 1102, two QSMs 1124 and 1202, a dual airlock VCE 1126, a VTM (vacuum) transfer robot 1118, and a human operator 1204 are visible in schematic outline.

In some examples, an ATM transfer robot is located in the mini-environment (for example within an EFEM) stacked directly above the VTM chamber and transfers wafers between the transfer robot c FOUPs and the LLs. The ATM transfer robot is provided with a drive up and arm-set down, or a drive down and arm-set up, configuration. In some examples, load ports are disposed within the boundary of the wafer process modules. This arrangement may, however, pose a challenge when provided in relatively tall system configurations as parts of the system should not typically be allowed to interfere with overhead AMHS tracks within a fabrication room. In some fabrication rooms however, where an atypical layout of the AMHS tracks is allowed, or where the AMHS has the capability to rotate FOUPS before delivery, this alternate load port arrangement may be a convenient and useful differentiator over conventional systems.

Figure 15:
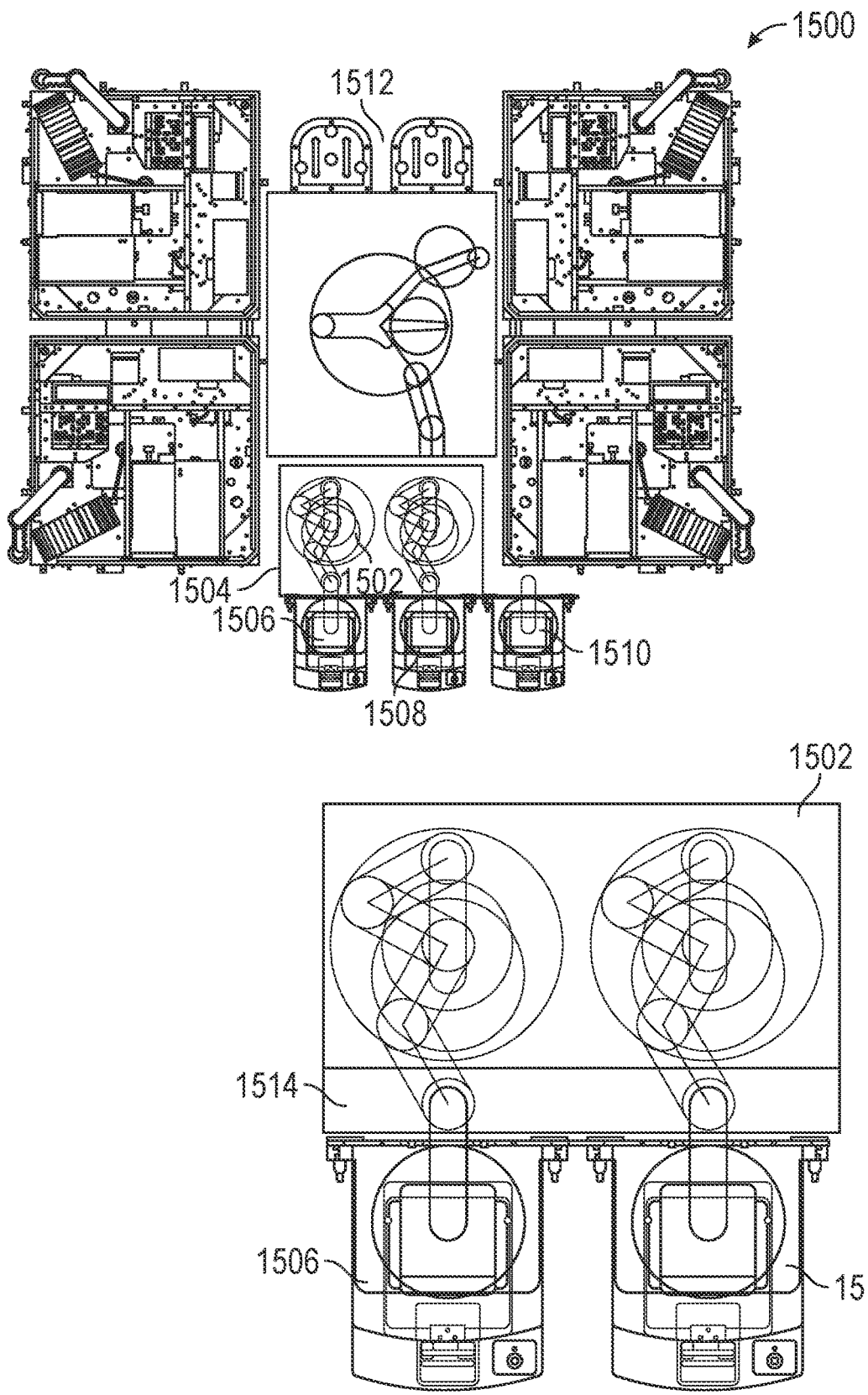
FIG. 15 is a top view of a system configuration, according to an example embodiment.

A further design criterion can include a consideration of where to fit additional FOUPs that may be needed for very high throughput systems. Certain arrangements are possible, as now described. With reference to FIG. 15, in an example system configuration 1500, two load ports 1502 may extend at 1504 beyond the existing (conventional) boundary of a wafer processing tool. Although this embodiment may sacrifice some of the footprint reduction discussed above (and therefore impact footprint productivity), it may nevertheless eliminate some problems of the AMHS/wafer processing system interference referenced earlier. Additional FOUPS (in other words, more than two FOUPs) 1506, 1508, and 1510 may be added to this system by adding a FOUP buffer.

Further buffer stations or a VTM extension 1512 may also be included in this system configuration 1500. In another example configuration shown in the lower view, a mini-EFEM 1514 may be provided between the FOUPs 1506 and 1510, and the load ports 1502.

The mini-EFEM 1514 may include an EFEM conversion to N2. The mini-EFEM 1514 also includes a relatively small volume EFEM that significantly lowers the leak rate to ATM because there are fewer and shorter gaps in panels recirculation, and piping. The mini-EFEM 1514 also results in a lower N2 consumption resulting in lower cost of EFEM frame, panels, filters, and fans.

In one example embodiment, the example system configuration 1500 also include a power distribution enclosure (not shown) disposed under the mini-EFEM 1514 and/or both FOUPs 1506 and 1510. The power distribution enclosure may fit under the EFEM 1514 and/or both FOUPs 1506 and 1510. In one example embodiment, a depth of the power distribution enclosure does not exceed a combined depth of the EFEM 1514 and both FOUPs 1506 and 1510.

Figure 16:
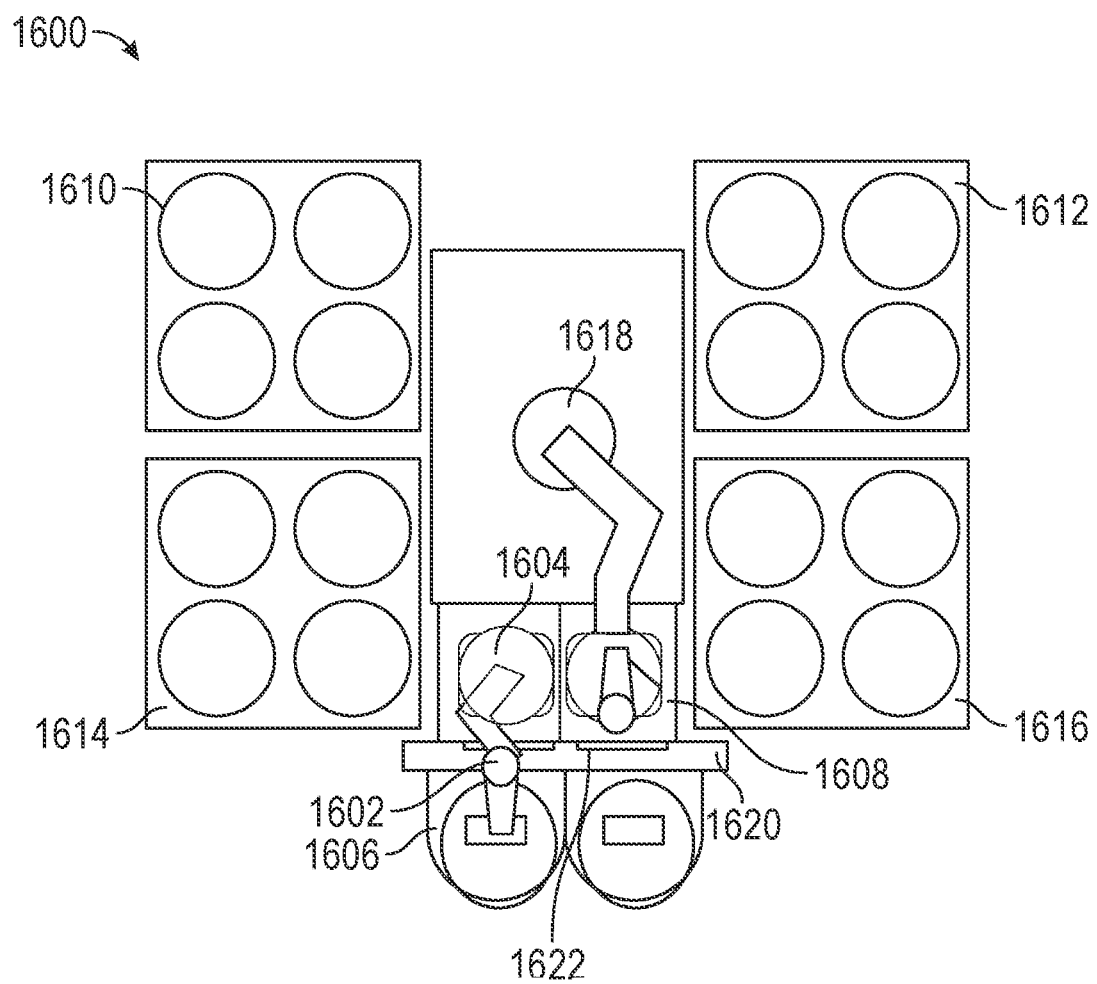
FIG. 16 is a top view of a system configuration, according to an example embodiment.

An example system configuration 1600 in FIG. 16 includes four QSMs 1610, 1612, 1614, and 1616. A load lock (LL) robot 1602 has a 25-stacked blade 1604 which can transfer 25 wafers from a FOUP 1606 to a load lock (LL) 1608. A large Z-direction stroke of the LL robot 1602 enables staging of wafers for VTM transfer. A VTM robot 1618 picks up and places wafers directly from and to the LL robot 1602. An EFEM minienvironment 1620 is only 6 inches deep (in some examples), which is just enough thickness for the actuation of double doors 1622. The double doors 1622 may include an LPM of 100 mm SEMI exclusion, and 2 inches ATM door actuation. The LL robot 1602 reach can be extended if needed. Convenient features include the elimination of a traditional robot and the provision of a mini-environment that reduces overall EFEM depth from a traditional 20 inches to approximately 6 inches, which corresponds to an approximate 300% reduction. The reduced EFEM volume can simplify the use of alternate purge gases in the mini-environment (such as nitrogen gas $N_2$).

In one example embodiment, the example system configuration 1600 also include a power distribution enclosure (not shown) disposed under the LPM.

In another example embodiment, instead of a FOUP stocker to ensure FOUPs are available for exchange, the AMHS system could be configured with a local FOUP buffer.

Figure 17:
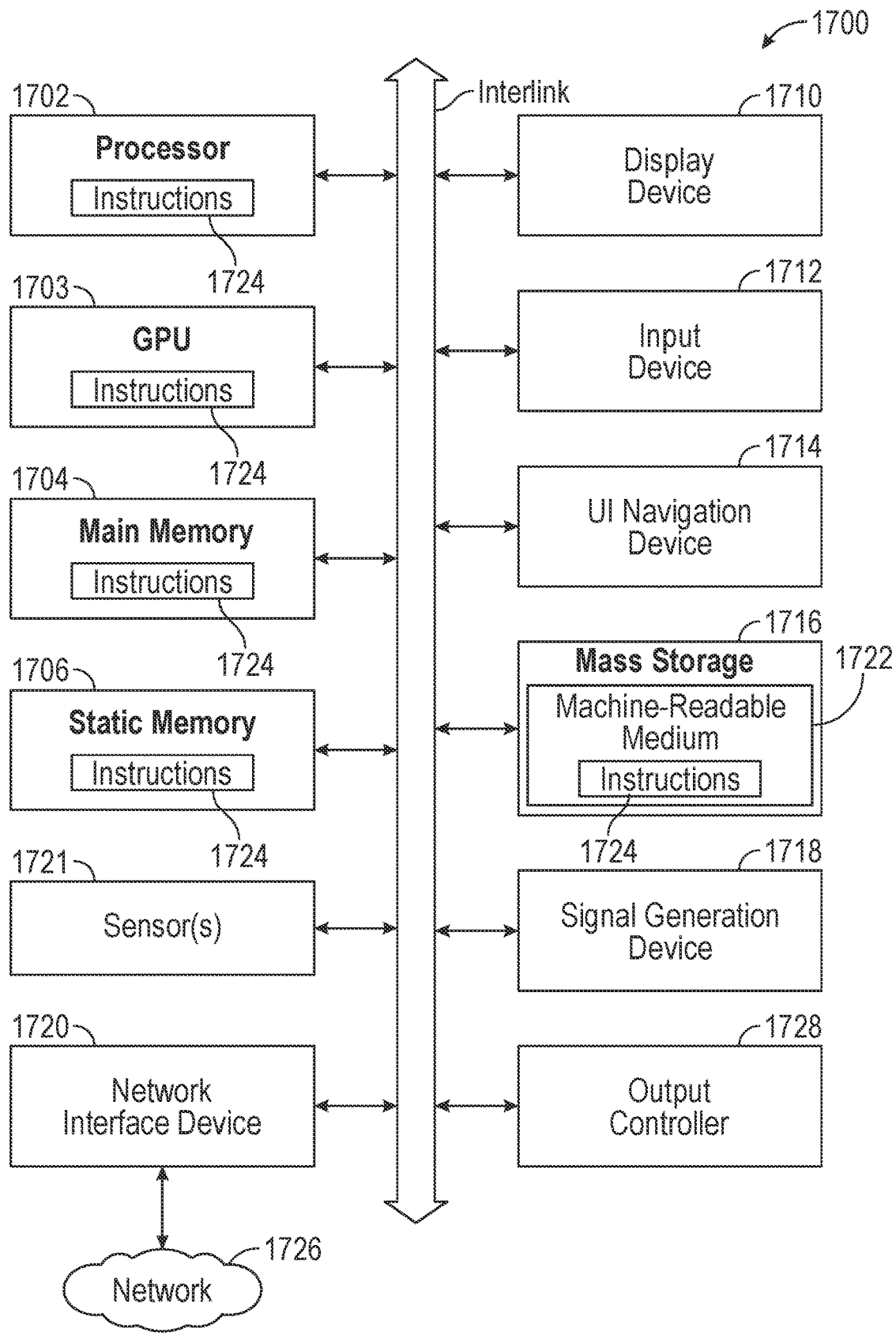
FIG. 17 is a block diagram illustrating an example of a controller or machine by which one or more example method embodiments may be controlled.

FIG. 17 is a block diagram illustrating an example of a controller or machine 1700 by which one or more example methods described herein may be controlled. In alternative embodiments, the machine 1700 may operate as a stand-alone device or may be connected (e.g., networked) to other machines. In a networked deployment, the machine 1700 may operate in the capacity of a server machine, a client machine, or both in server-client network environments. In an example, the machine 1700 may act as a peer machine in a peer-to-peer (P2P) (or other distributed) network environment. Further, while only a single machine 1700 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant massed particles, etc.) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 1700 may include a hardware processor 1702 (e.g., a central processing unit (CPU), a hardware processor core, or any combination thereof), a graphics processing unit (GPU) 1703, a main memory 1704, and a static memory 1706, some or all of which may communicate with each other via an interlink (e.g., bus) 1708. The machine 1700 may further include a display device 1710, an alphanumeric input device 1712 (e.g., a keyboard), and a user interface (UI) navigation device 1714 (e.g., a mouse). In an example, the display device 1710, alphanumeric input device 1712, and UI navigation device 1714 may be a touch screen display. The machine 1700 may additionally include a mass storage device (e.g., drive unit) 1716, a signal generation device 1718 (e.g. a speaker), a network interface device 1720, and one or more sensors 1721, such as a Global Positioning System (GPS) sensor, compass, accelerometer, or another sensor. The machine 1700 may include an output controller 1728, such as a serial (e.g., universal serial bus (USB)), parallel, or other wired or wireless (e.g., infrared (IR), near field communication (NFC), etc.) connection to communicate with or control one or more peripheral devices (e.g., a printer, card reader, etc.).

The mass storage device 1716 may include a machine-readable medium 1722 on which is stored one or more sets of data structures or instructions 1724 (e.g., software) embodying or utilized by any one or more of the techniques or functions described herein. The instructions 1724 may also reside, completely or at least partially, within the main memory 1704, within the static memory 1706, within the hardware processor 1702, or within the GPU 1703 during execution thereof by the machine 1700. In an example, one or any combination of the hardware processor 1702, the GPU 1703, the main memory 1704, the static memory 1706, or the mass storage device 1716 may constitute machine-readable media.

While the machine-readable medium 1722 is illustrated as a single medium, the term "machine-readable medium" may include a single medium, or multiple media (e.g., a centralized or distributed database, and/or associated caches and servers) configured to store the one or more instructions 1724.

The term "machine-readable medium" may include any medium that is capable of storing, encoding, or carrying instructions 1724 for execution by the machine 1700 and that cause the machine 1700 to perform any one or more of the techniques of the present disclosure, or that is capable of storing, encoding, or carrying data structures used by or associated with such instructions 1724. Non-limiting machine-readable medium examples may include solid-state memories, and optical and magnetic media. In an example, a massed machine-readable medium comprises a machine-readable medium 1722 with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks. The instructions 1724 may further be transmitted or received over a communications network 1726 using a transmission medium via the network interface device 1720.

Although an embodiment has been described with reference to specific example embodiments, it will be evident that various modifications and changes may be made to these embodiments without departing from the broader scope of the invention. Accordingly, the specification and drawings are to be regarded in an illustrative rather than a restrictive sense. The accompanying drawings that form a part hereof, show by way of illustration, and not of limitation, specific embodiments in which the subject matter may, be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A system comprising:
   a vacuum transfer module (VTM) configured to receive a plurality of wafers, the VTM comprising a VTM transfer robot;
   a plurality of quad station process modules (QSMs) coupled to the VTM, the VTM transfer robot configured to transfer wafers between the VTM and the plurality of QSMs;
   a system controller coupled to the VTM transfer robot, the system controller configured to control at least one of an operation of the VTM transfer robot or a rotation of respective mechanical indexers of the plurality of QSMs; and
   a first atmospheric (ATM) transfer robot configured to transfer a batch of wafers across a first wafer plane extending horizontally from a load port of one or more elevated load ports above a second ATM transfer robot to a service door located adjacent to a top portion of a vertically-movable dual airlock vacuum cassette elevator (VCE),
   the service door and a lower service door providing access to and from the VTM, the lower service door allowing movement of wafers under vacuum from the VCE to the VTM, and
   the VTM transfer robot configured to transfer wafers within the VTM along a second wafer plane extending horizontally and separate from the first wafer plane.

2. The system of claim 1, wherein the plurality of QSMs comprises a first, second, third, and fourth QSM, the first and second QSM being coupled to a first side of the VTM, the third and fourth QSM being coupled to a second side of the VTM, the second side being opposite to the first side,
   wherein an equipment front-end module (FEEM) is coupled to a third side of the VTM, the VTM being four-sided, and
   wherein each QSM of the plurality of QSMs includes at least one of the respective mechanical indexers.

3. The system of claim 1, wherein the VTM transfer robot comprises two arms, each arm having a single effector or two vertically stacked end effectors.

4. The system of claim 1, wherein each QSM has at least one single load station that is accessible via a respective slot.

5. The system of claim 1, wherein a side of the VTM is substantially planar, wherein the side is configured to be coupled with two of the plurality of QSMs, and each of the plurality of QSMs having at least one load station coupled to the side.

6. The system of claim 1, wherein an equipment front-end module (EFEM) is arranged at least partially between two of the plurality of QSMs and reduces a footprint of the system.

7. The system of claim 1, further comprising:
   two load ports connected to an external side of an equipment front-end module (EFEM), a platform-to-VTM width defined by two load-port interfaces of the two load ports, a platform depth defined by a load port depth, and a depth defined by at least one of the plurality of QSMs.

8. The system of claim 1, further comprising:
   one or more load ports coupled to a side of an equipment front-end module (EFEM), the one or more load polls being disposed within physical boundaries of the plurality of QSMs.

9. The system of claim 1, comprises:
   an equipment front-end module (EFEM) configured to receive a plurality of wafers.

10. The system of claim 8, wherein the VTM transfer robot is located near a lateral side of the VTM, and allows service access past the VTM transfer robot under vacuum conditions.

11. The system of claim 8, wherein the first ATM transfer robot is located within the EFEM and is stacked above a chamber of the VTM and transfers wafers between a front opening unified pod (FOUP) and a load lock (LL), the first ATM transfer robot provided with a drive up and arm-set down configuration or a drive down and arm-set up configuration.

12. The system of claim 9, wherein one or more components of the EFEM fall within existing boundaries of processing modules or tools of the system.

13. The system of claim 12, wherein the one or more components of the EFEM comprise load ports, a mini-environment module, the first ATM transfer robot, and a load lock.

14. The system of claim 13, wherein the load ports, the mini-environment module, and the first ATM transfer robot are located over a chamber of the VTM.

15. The system of claim 9, further comprising:
   a plurality of load ports connected to an external side of the EFEM, the external side being opposite to the VTM;
   a plurality of FOUPs coupled to the plurality of load ports; and
   a mini-EFEM coupled between the plurality of load ports and the plurality of FOUPs.

16. A method comprising:
   receiving a plurality of wafers at an equipment front-end module (EFEM), the EFEM comprising a first atmospheric (ATM) transfer robot;
   transferring, using the first ATM transfer robot, at least one of the plurality of wafers from the EFEM to a vacuum transfer module (VTM) across a first wafer plane extending horizontally from one or more elevated load ports above a second ATM transfer robot to a service door adjacent to a top portion of a vertically-movable dual airlock vacuum cassette elevator (VCE), the service door and a lower service door providing access to the VTM, the lower service door allowing movement of at least one of the plurality of wafers under vacuum from the VCE to the VTM, and the VTM comprising a VTM transfer robot; and
   transferring, using the VTM transfer robot, the at least one of the plurality of wafers from the VTM along a second wafer plane extending horizontally and separate from the first wafer plane to a plurality of quad station process modules (QSMs) that are coupled to the VTM.

17. The method of claim 16, wherein the plurality of QSMs comprises a first, second, third, and fourth QSM, the first and second QSM being coupled to a first side of the VTM, the third and fourth QSM being coupled to a second side of the VTM, the second side being opposite to the first side,
   wherein the EFEM is coupled to a third side of the VTM, the VTM being four-sided, and wherein each QSM of the plurality of QSMs includes mechanical indexers.

18. The method of claim 16, wherein the first ATM transfer robot and the VTM transfer robot each comprises two arms, each arm having a single effector or two vertically stacked end effectors.

19. The method of claim 16, wherein each QSM has at least one load station that is accessible via a respective slot.

20. The method of claim 16, wherein a side of the VTM is substantially planar, wherein the side is configured to be coupled with at least two of the plurality of QSMs, each of the plurality of QSMs having at least one load station coupled to the side.

* * * * *